(12) United States Patent
Fraser et al.

(10) Patent No.: US 8,437,718 B2
(45) Date of Patent: *May 7, 2013

(54) GAIN INDEX BASED RADIO CALIBRATION

(75) Inventors: Colin Fraser, Mountain View, CA (US); Mark Gonikberg, Los Altos Hills, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/536,467

(22) Filed: Jun. 28, 2012

(65) Prior Publication Data

US 2012/0264379 A1    Oct. 18, 2012

Related U.S. Application Data

(63) Continuation of application No. 12/431,231, filed on Apr. 28, 2009, now Pat. No. 8,233,866.

(51) Int. Cl.
*H04B 17/00*    (2006.01)

(52) U.S. Cl.
USPC .............. 455/226.1; 455/67.11; 455/114.2; 375/296

(58) Field of Classification Search ............ 455/3.1, 455/67.11, 114.2–114.3, 501, 226.1; 375/296–297
See application file for complete search history.

(56) References Cited

U.S. PATENT DOCUMENTS 8,233,866 B2 *  7/2012  Fraser et al. .............. 455/226.1

* cited by examiner

*Primary Examiner* — Long Nguyen
(74) *Attorney, Agent, or Firm* — Garlick & Markison

(57) ABSTRACT

A wireless device includes an antenna, Radio Frequency (RF) circuitry, and baseband processing circuitry. The baseband processing circuitry couples to the RF circuitry and is operable to determine operational calibrations settings that may include pre-distortion characteristics and RF signal path settings, both of which are determined via calibration operations. The calibration operations are initiated when an operational value of the wireless device compares unfavorably to at least one operational threshold. Monitoring circuitry coupled to the RF circuitry and to the baseband processing circuitry monitors operational characteristics of the RF circuitry. Calibration operations may be initiated based upon RF circuitry temperature, supply voltage, PA current, PA gain input level/average, among other triggers.

20 Claims, 17 Drawing Sheets

GAIN INDEX BASED RADIO CALIBRATION

CROSS REFERENCES TO RELATED APPLICATIONS

The present U.S. Utility patent application claims priority under 35 U.S.C. §120, as a continuation of U.S. Utility patent application Ser. No. 12/431,231, filed Apr. 28, 2009, which is incorporated herein by reference in its entirety for all purposes.

BACKGROUND

1. Technical Field

This invention relates generally to communication systems and more particularly to Radio Frequency (RF) front end calibration/recalibration.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11x, Bluetooth, wireless wide area networks (e.g., WiMAX), advanced mobile phone services (AMPS), digital AMPS, global system for mobile communications (GSM), North American code division multiple access (CDMA), Wideband CDMA, local multi-point distribution systems (LMDS), multi-channel-multi-point distribution systems (MMDS), radio frequency identification (RFID), Enhanced Data rates for GSM Evolution (EDGE), General Packet Radio Service (GPRS), and many others.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations, and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard. As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna. Any of the analog signal path components may distort the outgoing RF signals, which results in poor received signal quality at a communicatively coupled device. Such distortion may result in requiring more transmit power, higher coding rates, or simply degradation in communication link performance.

Most, if not all wireless communication standards limit transmitted power level. Further, some wireless communication standards include reverse link power control, which allows a remote device to control transmit power of another wireless device, e.g., base station controls reverse link transmit power of hand held devices. Thus, in most if not all wireless devices, the power amplifier is actively controlled to thereby control transmit power. Shortcomings exist with respect to the efficiency of the power amplifier. When the power amplifier is matched well with the antenna, efficient transmission results. However, if mismatch is present, inefficiency results. Such inefficiency results in excess power drain (by the power amplifier) as well as reduction in transmit power. This mismatch can occur due to operational variations of the antenna, e.g., alteration of input impedance due to antenna configuration/position, as well as operational variations of the power amplifier and other RF signal path components of the wireless device due to temperature fluctuations, voltage supply variations, etc. Therefore, a need exists for a wireless device that is capable of at least partially overcoming one or more of the above mentioned limitations.

BRIEF SUMMARY OF THE INVENTION

The present invention is directed to apparatus and methods of operation that are further described in the following Brief Description of the Drawings, the Detailed Description of the Invention, and the Claims. Other features and advantages of the present invention will become apparent from the following detailed description of the invention made with reference to the accompanying drawings.

DETAILED DESCRIPTION OF THE INVENTION

Figure 1:
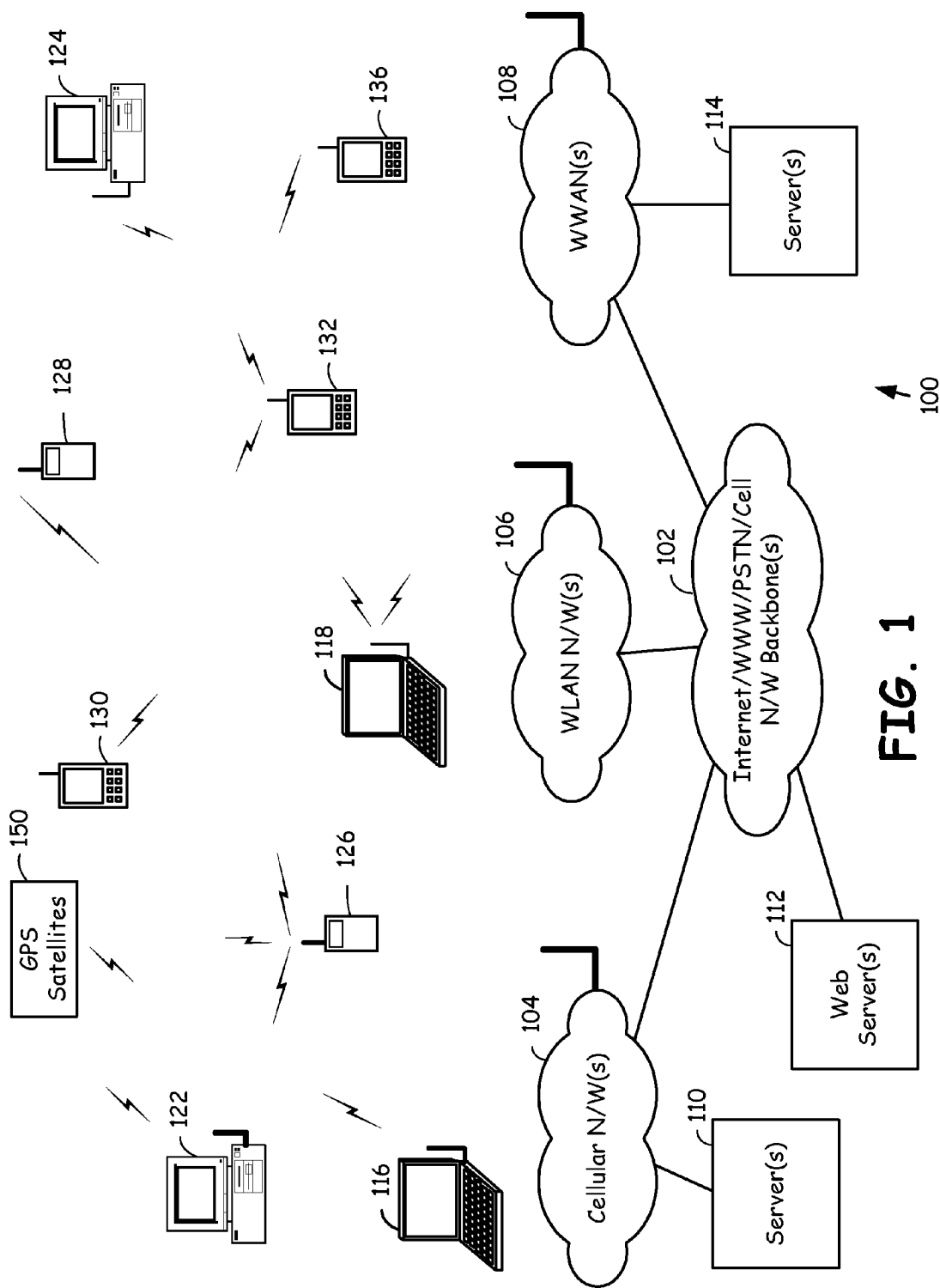
FIG. 1 is a system diagram illustrating a wireless communication system constructed and operating according to one or more embodiments of the present invention.

FIG. 1 is a system diagram illustrating a wireless communication system constructed and operating according to one or more embodiments of the present invention. The wireless communication system 100 of FIG. 1 includes a communication infrastructure and a plurality of wireless devices. The communication infrastructure includes one or more cellular networks 104, one or more wireless local area networks (WLANs) 106, and one or more wireless wide area networks (WWANs) 108. The cellular networks 104, WLANs 106, WWANs 108 all typically couple to one or more backbone networks. The backbone networks 102 may include the Internet, the Worldwide Web, one or more public switched telephone network backbones, one or more cellular network backbones, one or more private network backbones and/or other types of backbones that support communications with the various wireless network infrastructures 104, 106, and 108. Server computers may couple to these various network infrastructures. For example, server computer 110 couples to cellular network 104, web server 112 couples to the Internet/WWW/PSTN/Cell network 102, and server 114 couples to WWAN network 108. Other devices may couple to these networks as well in various other constructs.

Each of the cellular networks 104, WLANs 106, and WWANs 108 support wireless communications with wireless devices in various wireless spectra and according to various communication protocol standards. For example, the cellular network 104 may support wireless communications with wireless devices within the 800 MHz band and the 1900 MHz band, and/or other Radio Frequency (RF) bands that are allocated for cellular network communications. The cellular network 104 may support GSM, EDGE, GPRS, 3G, CDMA, TDMA, and/or various other standardized communications. Of course, these are examples only and should not be considered to limit the spectra or operations used by such cellular networks. The WLANs 106 typically operate within the Industrial, Scientific, and Medical (ISM) bands that include the 2.4 GHz and 5.8 GHz bands. The ISM bands include other frequencies as well that support other types of wireless communications, such bands including the 6.78 MHz, 13.56 MHz, 27.12 MHz, 40.68 MHz, 433.92 MHz, 915 MHz, 24.125 GHz, 61.25 GHz, 122.5 GHz, and 245 GHz bands. The WWANs networks 108 may operate within differing RF spectra based upon that which is allocated at any particular locale. Device to device communications may be serviced in one of these frequency bands as well.

The wireless network infrastructures 104, 106, and 108 support communications to and from wireless devices 116, 118, 122, 124, 126, 128, 130, 132, and/or 136. Various types of wireless devices are illustrated. These wireless devices include laptop computers 116 and 118, desktop computers 122 and 124, cellular telephones 126 and 128, portable beta terminals 130, 132, and 136. Of course, differing types of devices may be considered wireless devices within the context of the scope of the present invention. For example, automobiles themselves having cellular interfaces would be considered wireless devices according to the present invention. Further, any device having a wireless communications interface either bi-directional or uni-directional, may be considered a wireless device according to the present invention, in various other types of wireless devices. For example, wireless devices may include Global Positioning System (GPS) receiving capability to receive positioning signals from multiple GPS satellites 150.

The wireless devices 116-136 may support peer-to-peer communications as well, such peer-to-peer communications not requiring the support of a wireless network infrastructure. For example, these devices may communicate with each other in a 60 GHz spectrum, may use a peer-to-peer communications within a WLAN spectrum, for example, or may use other types of peer-to-peer communications. For example, within the ISM spectra, wireless devices may communicate according to Bluetooth protocol or any of the various available WLAN protocols supported by IEEE802.11x, for example.

As will be further described with reference to FIGS. 2-17, each of the wireless devices 116-136 illustrated in FIG. 1 includes baseband processing circuitry, a Radio Frequency (RF) transceiver, and at least one antenna. According to the present invention, these components are periodically calibrated in an attempt to provide power consumption efficient and operationally acceptable RF energy transmission. Structure and operations according to the present invention allow the RF transceiver to support operational requirements while minimizing power consumption, which is particularly important for battery powered devices.

Figure 2:
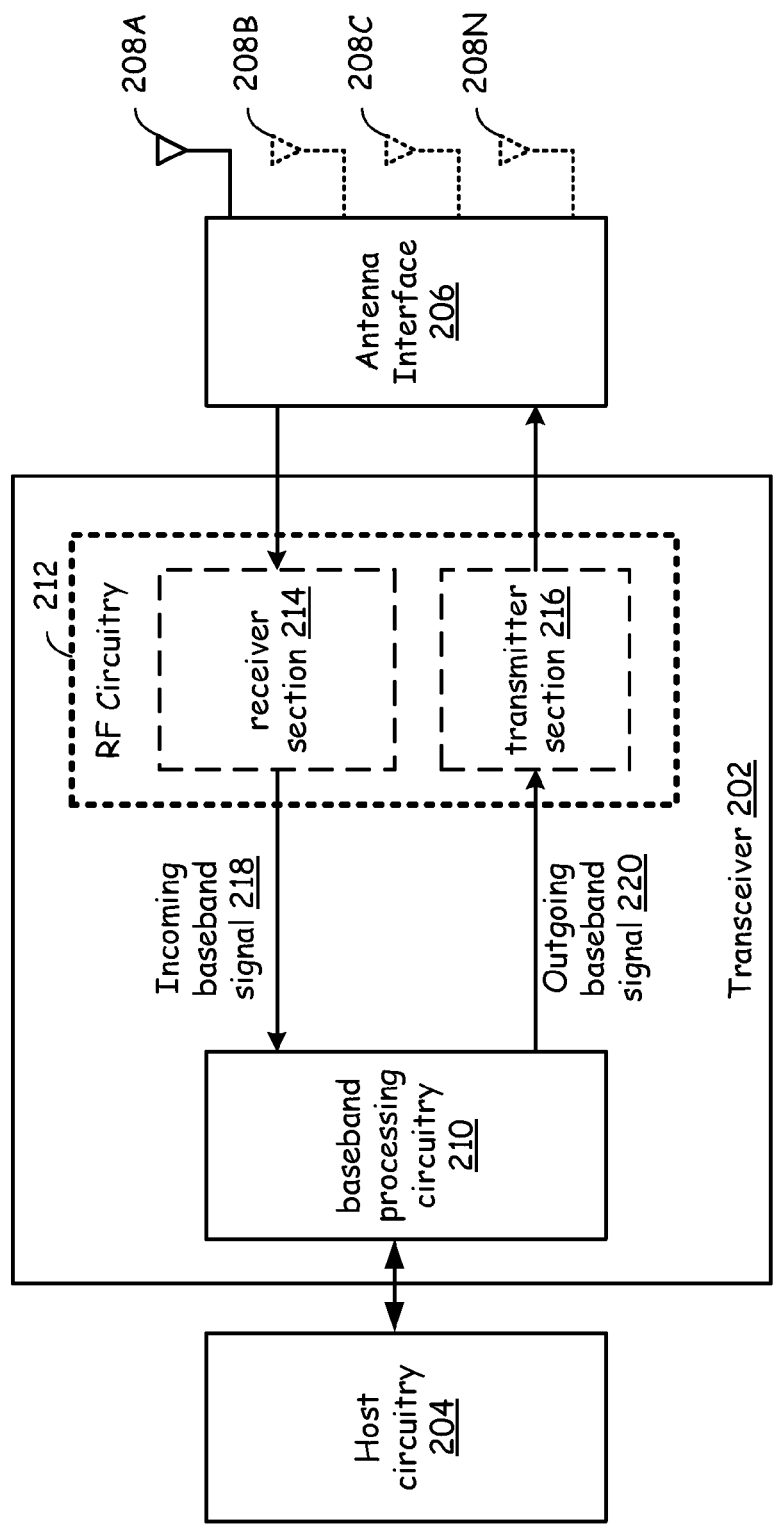
FIG. 2 is a block diagram illustrating components of a wireless device constructed and operating according to the present invention.

FIG. 2 is a block diagram illustrating components of a wireless device constructed and operating according to the present invention. The wireless device includes host circuitry 204, RF transceiver 202, antenna interface 206, and a plurality of antenna elements 208A, 208B, 208C, and 208N. In some embodiments of the wireless device of FIG. 2, the antenna may include only a single antenna element. However, as shown, in FIG. 2 the antenna may have a plurality of antenna elements 208A-208N which are configurable by the antenna interface 206. Configurability via antenna interface 206 may include operation with directionality, MIMO, or other multiple antenna configurations.

Host circuitry 204 may include processing circuitry, memory, user interfaces, wired interfaces, and/or other circuitry associated with the wireless device. For example, wireless devices typically have a display, a keyboard, and/or multiple other user interface devices. Further, the wireless device includes one or more batteries for powering the wireless device. The RF transceiver 202 includes baseband processing circuitry 210 and RF circuitry 212. The baseband processing circuitry 210 produces an outgoing baseband signal 220 to a transmitter section 216 of the RF circuitry 212. Receiver section 214 of the RF circuitry 212 produces an incoming baseband signal 218 to the baseband processing circuitry 210. RF circuitry 212 produces an outgoing RF signal from transmitter section 216 to antenna interface 206. The antenna interface 206 couples the outgoing RF signal to one or more of the plurality of antenna elements 208A-208N. Receiver section 214 of RF circuitry 212 receives an incoming RF signal from antenna interface 206 and converts the incoming RF signal to the incoming baseband signal 218. Likewise, the transmitter section 216 converts the outgoing baseband signal 220 to the outgoing RF signal which the transmitter section 216 produces to antenna interface 206.

According to the present invention, the baseband processing circuitry 210 is operable to produce the outgoing baseband signal 220 such that it is pre-distorted to compensate for at least one of antenna input impedance and RF circuitry signal distortion characteristics. For example, the RF circuitry 212, as will be described further herein with reference to FIG. 3, includes a plurality of components that operate upon the outgoing baseband signal 220. The components of the transmitter section 216 may distort the outgoing baseband signal prior to conversion to an RF signal, while converting the outgoing baseband signal to the RF signal, and/or when operating upon the RF signal. It is desirable that the RF signal be undistorted upon presentation to one or more of the antenna elements 208A-208N. Thus, the outgoing baseband signal 220 is pre-distorted to compensate for the distortion characteristics of the RF circuitry 212 transmitter section 216.

Further, the antenna interface 206 or an antenna that directly couples to the transmitter section 216 has input impedance that varies over time. In order to control transmit power from the antennas 208A-208N, the RF signal produced by transmitter section 216 has its amplitude adjusted accordingly. With the output impedance of the transmitter section 216 impedance matched to the input impedance of the antenna interface 206/antennas, maximal power delivery results. However, static impedance matching is typically only partially attainable or infrequently attainable due to the time varying nature of the input impedance to the antenna(s). Thus, the baseband processing circuitry 210 may also pre-distort the outgoing baseband signal 220 so that it compensates for the input impedance of antenna interface 206 (which applies impedance of antenna 208A-208N).

According to a first aspect of the present invention, the wireless device, in particular the baseband processing circuitry 210 is operable to initiate calibration operations when an operational value of the wireless device compares unfavorably to at least one operational threshold. As will be described further herein with reference to FIGS. 4-11, the transceiver 202 may include monitoring circuitry to monitor the operational characteristics of the RF circuitry 212. The operational characteristics may include temperature of the RF circuitry 212, one or more supply voltage levels that supply the RF circuitry 212, current drain of various components of the RF circuitry 212, output power of the transmitter section 216, and gain that is applied to one or more gain adjustable elements of the transmitter section 216 by the baseband processing circuitry.

According to a second aspect of the present invention, during calibration operations, to establish pre-distortion settings for the baseband processing circuitry 210 and/or to establish calibration settings for one or more of the transmitter section 216 components, gain/current is applied to the transmitter section 216 in a time varying pulsed format. The pulsed application of current gain during calibration operations reduces average current consumption over time of the RF circuitry 212 during the calibration operations. By inserting lower current periods between the highest current periods, the pulsed application also reduces effective peak current drain on the battery by better allowing capacitors of a power supply that supplies the RF circuitry to even out current demand of transmitter section 216 during the calibration operations. Reduction of the peak current requirements of the RF circuitry 212 during calibration operations may allow a system designer to use a smaller, less expensive and/or cheaper power supply and/or battery. These operations will be described further herein with reference to FIGS. 12-17.

Figure 3:
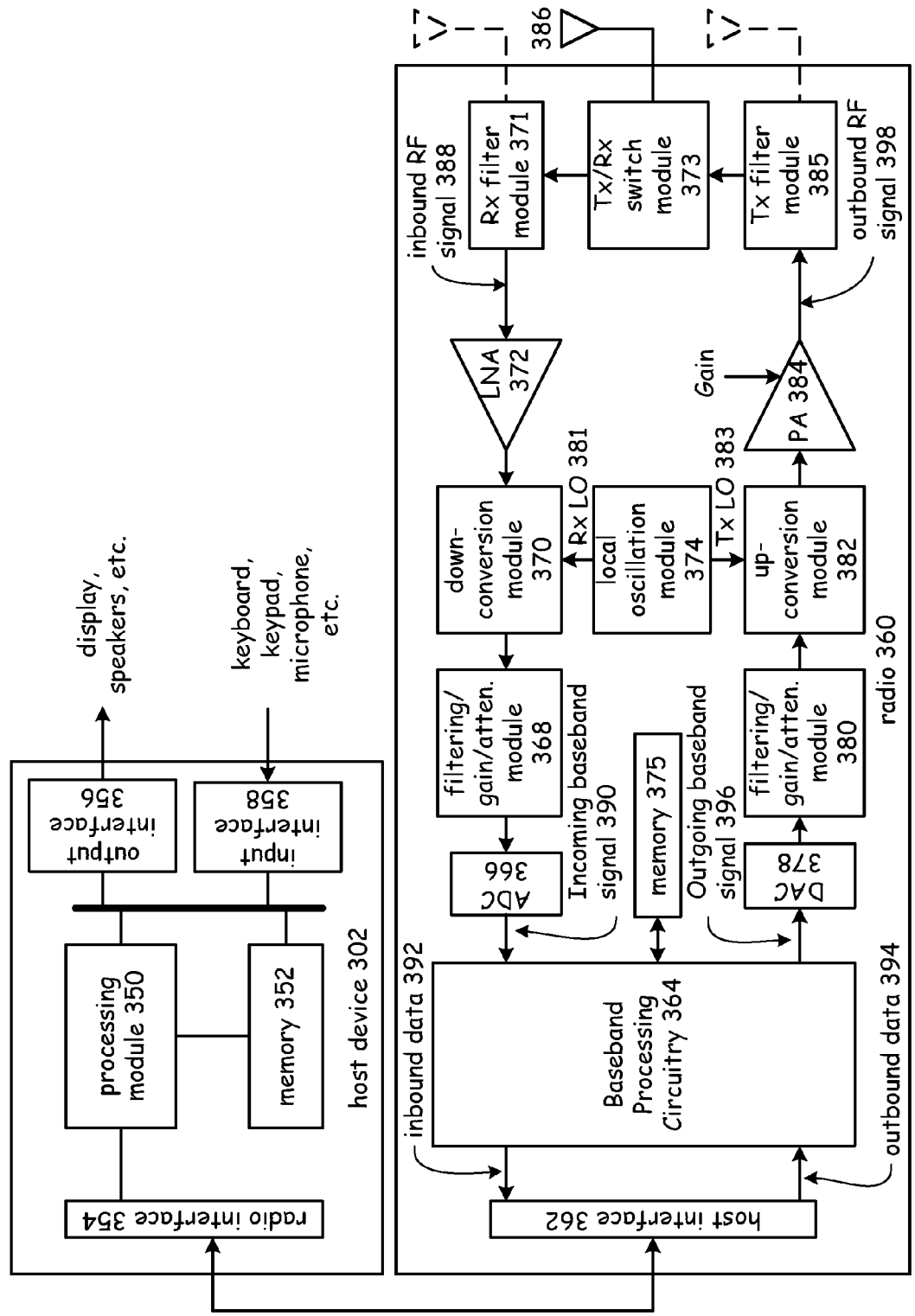
FIG. 3 is a schematic block diagram illustrating a wireless communication device that includes a host device and an associated radio.

FIG. 3 is a schematic block diagram illustrating a wireless communication device that includes a host device and an associated radio. For cellular telephone hosts, the radio 360 is a built-in component. For personal digital assistants hosts, laptop hosts, and/or personal computer hosts, the radio 360 may be built-in or may be an externally coupled component that couples to the host device 302 via a communication link, e.g., PCI interface, PCMCIA interface, USB interface, or another type of interface.

As illustrated, the host device 302 includes a processing module 350, memory 352, radio interface 354, input interface 358, and output interface 356. The processing module 350 and memory 352 execute the corresponding instructions that are typically done by the host device. For example, for a cellular telephone host device, the processing module 350 performs the corresponding communication functions in accordance with a particular cellular telephone standard.

The radio interface 354 allows data to be received from and sent to the radio 360. For data received from the radio 360 (e.g., inbound data), the radio interface 354 provides the data to the processing module 350 for further processing and/or routing to the output interface 356. The output interface 356 provides connectivity to an output display device such as a display, monitor, speakers, et cetera, such that the received data may be displayed. The radio interface 354 also provides data from the processing module 350 to the radio 360. The processing module 350 may receive the outbound data from an input device such as a keyboard, keypad, microphone, et cetera via the input interface 358 or generate the data itself. For data received via the input interface 358, the processing module 350 may perform a corresponding host function on the data and/or route it to the radio 360 via the radio interface 354.

Radio 360 includes a host interface 362, baseband processing circuitry/baseband processing module 364, an analog-to-digital converter (ADC) 366, a filtering/gain/attenuation module 368, an IF mixing down conversion stage 370, a receiver filter 371, a low noise amplifier (LNA) 372, a transmitter/receiver switch 373, a local oscillation module 374, memory 375, a digital-to-analog converter (DAC) 378, a filtering/gain/attenuation module 380, an IF mixing up conversion stage 382, a power amplifier (PA) 384, a transmitter filter module 385, and one or more antennas 386. The antenna 386 may be a single antenna that is shared by the transmit and receive paths as regulated by the Tx/Rx switch 373, or may include separate antennas for the transmit path and receive path. The antenna implementation will depend on the particular standard to which the wireless communication device is compliant and the particular design of the device.

The baseband processing circuitry 364, in combination with operational instructions stored in memory 375, executes digital receiver functions and digital transmitter functions. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The baseband processing circuitry 364 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 375 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing circuitry 364 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 375 stores, and the baseband processing circuitry 364 executes, operational instructions that facilitate functionality of the device.

In operation, the radio 360 receives outbound data 394 from the host device via the host interface 362. The host interface 362 routes the outbound data 394 to the baseband processing circuitry 364, which processes the outbound data 394 in accordance with a particular wireless communication standard (e.g., Cellular, WiMAX, IEEE802.11a, IEEE802.11b, IEEE802.11g, IEEE802.11n, Bluetooth, et cetera) to produce digital transmission formatted data/outgoing baseband signal 396. The digital transmission formatted data 396 will be a digital base-band signal or a digital low IF signal, where the low IF typically will be in the frequency range of one hundred kilohertz to a few megahertz.

The digital-to-analog converter 378 converts the digital transmission formatted data 396 from the digital domain to the analog domain. The filtering/gain/attenuation module 380 filters and/or adjusts the gain of the analog signal prior to providing it to the IF mixing stage 382. The IF mixing stage 382 directly or via multiple conversion steps (super heterodyne) converts the analog baseband or low IF signal into an RF signal based on a transmitter local oscillation 383 provided by local oscillation module 374. The power amplifier (PA) 384 amplifies the RF signal to produce outbound RF signal 398, which is filtered by the transmitter filter module 385. The antenna 386 transmits the outbound RF signal 398 to a targeted device such as a base station, an access point, and/or another wireless communication device. One or more of the components of the transmit path have variable gain. In some embodiments, the PA 384 has variable gain. However, in other embodiments, the gain of the PA 384 is fixed and the gain of elements prior to the PA 384 are gain variable.

The radio 360 also receives an inbound RF signal 388 via the antenna 386, which was transmitted by a base station, an access point, or another wireless communication device. The antenna 386 provides the inbound RF signal 388 to the receiver filter module 371 via the Tx/Rx switch 373, where the Rx filter 371 band pass filters the inbound RF signal 388. The Rx filter 371 provides the filtered RF signal to low noise amplifier (LNA) 372, which amplifies the signal 388 to produce an amplified inbound RF signal. The low noise amplifier 372 provides the amplified inbound RF signal to the IF mixing module 370, which directly converts the amplified inbound RF signal into an inbound low IF signal or baseband signal based on a receiver local oscillation 381 provided by local oscillation module 374. The down conversion module 370 provides the inbound low IF signal or baseband signal to the filtering/gain/attenuation module 368. The filtering/gain/attenuation module 368 may be implemented in accordance with the teachings of the present invention to filter and/or attenuate the inbound low IF signal or the inbound baseband signal to produce a filtered inbound signal.

The analog-to-digital converter 366 converts the filtered inbound signal from the analog domain to the digital domain to produce digital reception formatted data/incoming baseband signal 390. The baseband processing circuitry 364 decodes, descrambles, demaps, and/or demodulates the digital reception formatted data 390 to recapture inbound data 392 in accordance with the particular wireless communication standard being implemented by radio 360. The host interface 362 provides the recaptured inbound data 392 to the host device 18-32 via the radio interface 354.

As one of average skill in the art will appreciate, the wireless communication device of FIG. 3 may be implemented using one or more integrated circuits. For example, the host device may be implemented on one integrated circuit, the baseband processing circuitry 364, and memory 375 may be implemented on a second integrated circuit, and the remaining components of the radio 360, less the antenna(s) 386, may be implemented on a third integrated circuit. As an alternate example, the radio 360 may be implemented on a single integrated circuit. As yet another example, the processing module 350 of the host device and the baseband processing circuitry 364 may be a common processing device implemented on a single integrated circuit. Further, the memory 352 and memory 375 may be implemented on a single integrated circuit and/or on the same integrated circuit as the common processing modules of processing module 350 and the baseband processing circuitry 364.

Figure 4:
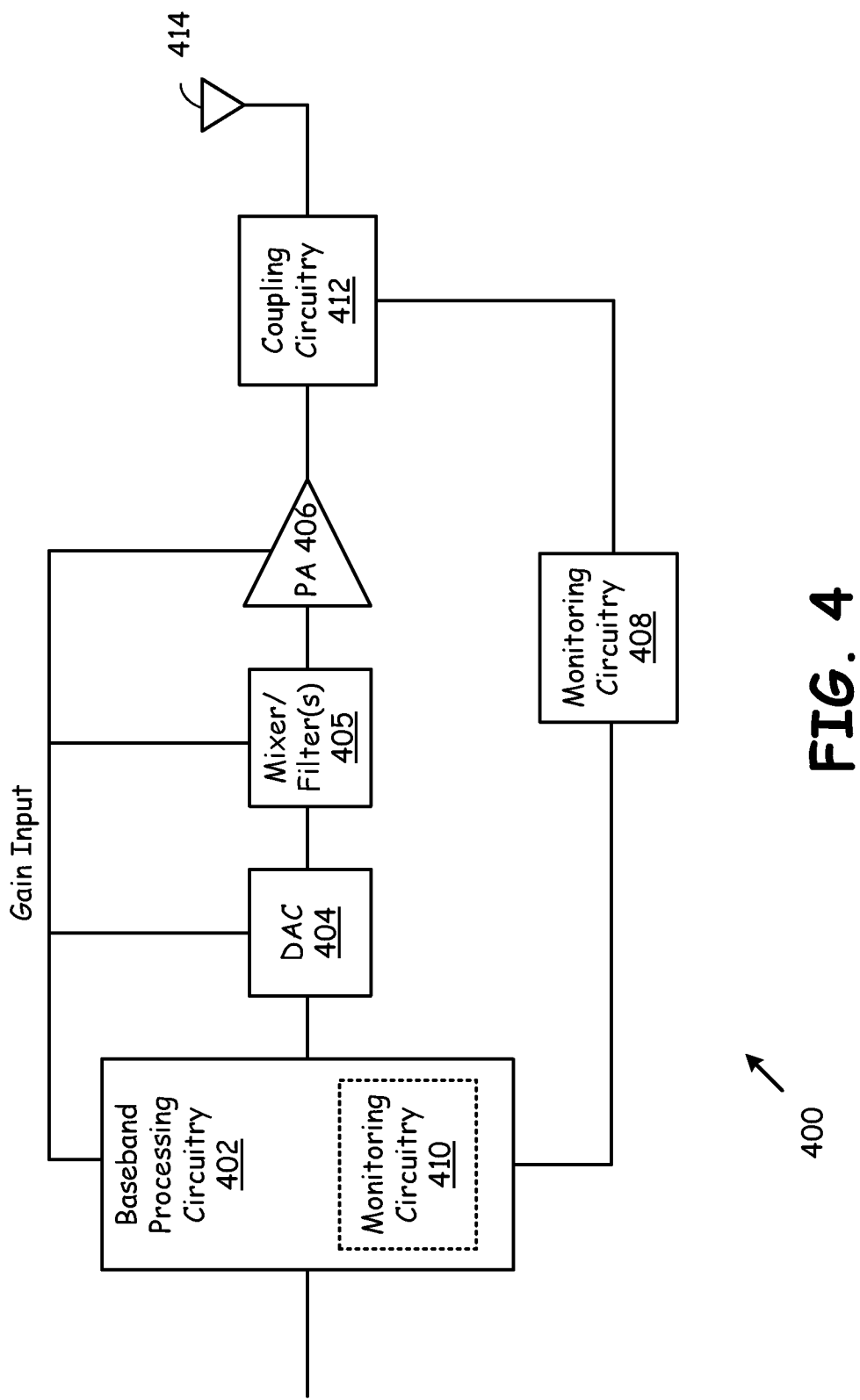
FIG. 4 is a block diagram illustrating components of a wireless device used for calibration of at least one Radio Frequency (RF) circuitry component.

FIG. 4 is a block diagram illustrating components of a wireless device used for calibration of at least one RF circuitry component. The wireless device includes baseband processing circuitry 402, a DAC 404, a PA 406, monitoring circuitry 408, coupling circuitry 412, and an antenna 414. The components of the wireless device illustrated in FIG. 4 would be accompanied by additional components in a cellular telephone, wireless WLAN device, Bluetooth device, or other wireless device. With the embodiment of FIG. 4, the baseband processing circuitry 410 may also include monitoring circuitry 410.

According to one aspect of the present invention, the baseband processing circuitry 402 produces a baseband signal in a digital format to DAC 404. Mixer/filter(s) 405 filter the output of DAC 404. PA 406 amplifies the output of the Mixer/filter(s) 405. The DAC 404, Mixer/filter(s) 405, and PA 406 are shown to have variable gain. With the structure of FIG. 4, baseband processing circuitry 402 controls the gain of DAC 404, Mixer/filter(s) 405, and PA 406. The manner in which baseband processing circuitry 402 controls the gain of PA 406 is generally known and will not be described further herein except as it relates to the teachings of the present invention. This baseband signal in the digital format produced to DAC is pre-distorted to compensate for RF circuitry signal distortion characteristics and at least one antenna 414 input impedance. Further, the DAC 404, Mixer/filter(s) 405, and PA 406 may be calibrated to alter their operational characteristics.

Figure 5B:
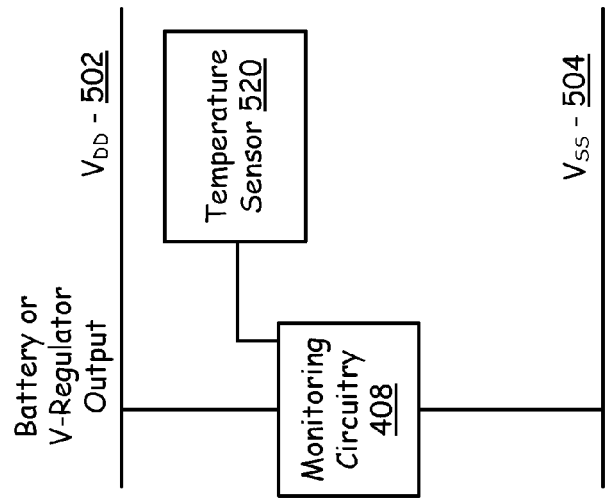
FIG. 5B is a block diagram illustrating another embodiment of monitoring circuitry and components monitored thereby according to one or more embodiments of the present invention.
Figure 5A:
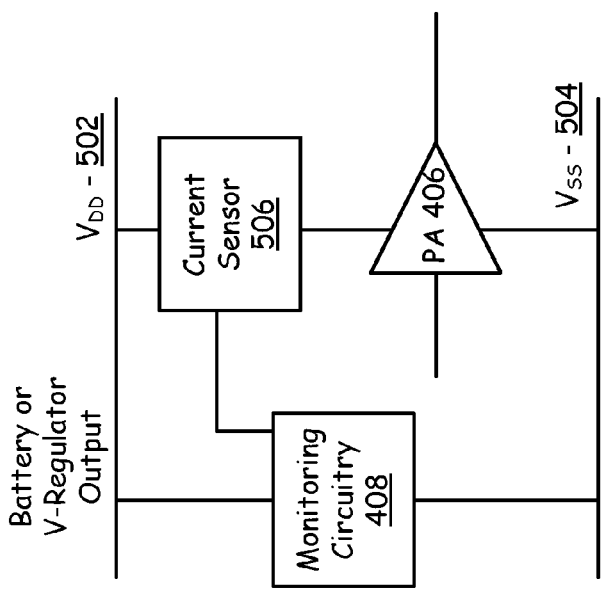
FIG. 5A is a block diagram illustrating particular structure of monitoring circuitry and RF circuitry characteristics monitored according to one or more embodiments of the present invention.

The monitoring circuitry 408 monitors the output of PA 406 via coupling circuitry 412. Monitoring circuitry 408 may also monitor characteristics of the transmitter section of the RF circuitry of a wireless device in different fashions. Further, monitoring circuitry 410 incorporated into baseband processing circuitry 402 may monitor characteristics of baseband processing circuitry 402 that relate to production of the baseband signal and also control of the gain of PA 406. Various embodiments of monitoring circuitry 408 that is separate from the baseband processing circuitry 402 are illustrated in FIGS. 5A and 5B. Operations of the structure of FIG. 4 when determining whether to initiate calibration operations are further described with reference to FIGS. 6-11 herein. Operations of the structure of FIG. 4 relating to how calibration operations are performed will be described further herein with reference to FIGS. 12-17.

FIG. 5A is a block diagram illustrating particular structure of monitoring circuitry and RF circuitry characteristics monitored according to one or more embodiments of the present invention. The monitoring circuitry 408 of FIG. 5A monitors the battery or voltage regulator output as well as the current provided to PA 406. When monitoring the battery or voltage regulator output, monitoring circuitry 408 monitors the difference in voltage between $V_{DD}$ 502 and $V_{SS}$ 504. The voltage between $V_{DD}$ 502 and $V_{SS}$ 504 is the supply voltage for powering PA 406. The gain of PA 406 is controlled by baseband processing circuitry 402 as illustrated in FIG. 4. At various gain inputs and with various operational conditions of PA 406, the PA 406 will draw particular current(s). Current sensor 506 senses the current being drawn by PA 506 and provides an indication of such to monitoring circuitry 408. The monitoring circuitry 408, based upon input regarding current drawn by PA 406 and/or the supply voltage level may decide to initiate calibration operations thereby. Further, monitoring circuitry 408 may consider only a single one of the voltage supply level or the current drain of the PA 406 in determining whether to initiate calibration operations.

FIG. 5B is a block diagram illustrating another embodiment of monitoring circuitry and components monitored thereby according to one or more embodiments of the present invention. The monitoring circuitry 408 of FIG. 5B monitors the voltage supply level (battery or regulator output) and temperature of the RF circuitry of the wireless device. Thus, temperature sensor 520 monitors the temperature of the RF circuitry and provides input to monitoring circuitry 408 based upon the temperature measured. Typically, the temperature sensor 520 does not directly measure temperature of RF circuitry but simply measures another characteristic that is indicative of the temperature of the RF circuitry. For example, conductivity of semiconductor material or resistivity of the semiconductor material of the RF circuitry is indicative of the temperature of the RF circuitry. Thus, temperature sensor 520 may monitor resistivity or conductivity of such material and provide it as input to monitoring circuitry 408. Monitoring circuitry 408 thereby provides an operational value to the baseband processing circuitry that is based upon input received from temperature sensor 520. Such operational value may be used to determine whether or not to enter calibration operations.

Figure 6:
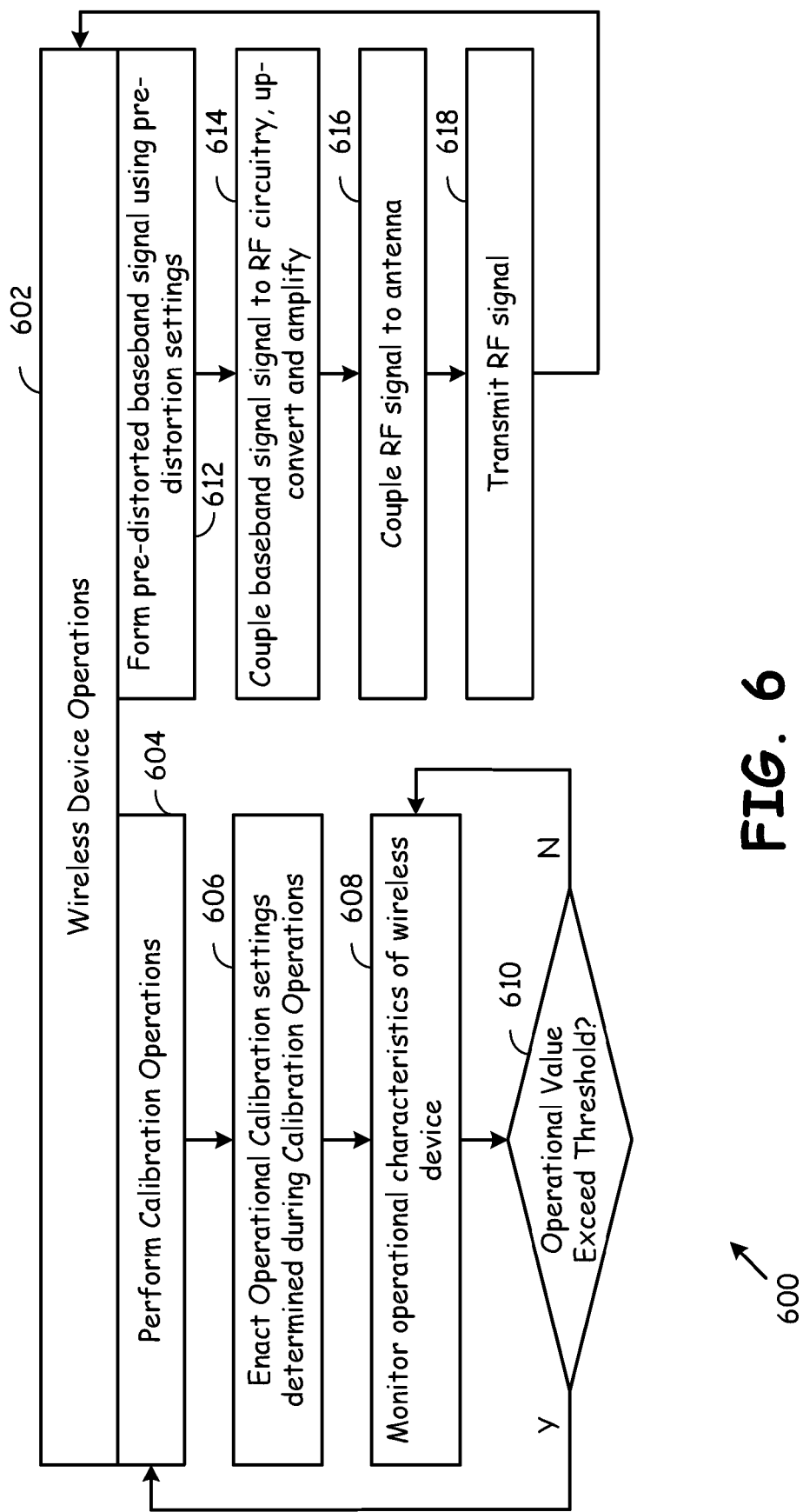
FIG. 6 is a flow chart illustrating operations of a wireless device according to one or more embodiments of the present invention.

FIG. 6 is a flow chart illustrating operations 600 of a wireless device according to one or more embodiments of the present invention. Operation 600 commence with the normal operations of the wireless device (Step 602). These operations at Step 602 are those other than relating to particular operations of the present invention. From Step 602, the wireless device may initiate calibration operations (Step 604). Calibration operations may be performed periodically, at start-up or reset, or based upon principles of the present invention. After the calibration operations of Step 604 are complete, the wireless device enacts operational calibration settings, which may include baseband processor pre-distortion settings and/or RF transmitter section calibration settings (Step 606). As was previously described, the pre-distortion settings of a baseband signal produced by baseband processing circuitry are set to compensate for subsequent distortion that is introduced by a transmitter section of RF circuitry of a wireless device and to pre-compensate for input impedance of one or more antennas coupled to the transmitter section. Further, RF circuitry calibration settings are set in an effort to improve/optimize the operation of the RF circuitry.

Then, from operation 606, the wireless device monitors operational characteristics of the wireless device (Step 608). The various operational characteristics of the wireless device that are monitored in Step 608 will be described further herein with reference to FIGS. 7-11. Then a determination is made whether the operational value relating to the operational characteristics of the wireless device exceeds a threshold (Step 610). When the operational value does not exceed a threshold as determined at Step 610, operation returns to Step 608 where operational characteristics of the wireless device continue to be monitored. However, when an operational value exceeds a threshold at Step 610, operation proceeds again to Step 604 wherein the calibration of the baseband processing circuitry and/or transmitter section components is performed.

During its operations in producing baseband signals for transmission, the baseband processing circuitry of the wireless device may pre-distort baseband signals using pre-distortion settings determined in calibration operations at Step 604 (Step 612). The baseband processing circuitry couples the baseband signals to the RF circuitry via an ADC (Step 614). The RF circuitry, in particular, transmitter section of the RF circuitry up-converts and amplifies and signals the baseband to produce an amplified RF signal. The transmitter section then couples the RF signal to an antenna, in some cases via an antenna interface (Step 616). A radiated RF signal is then transmitted from the antenna to one or more receiving devices (Step 618).

As is generally known, the gain of one or more transmitter section RF circuitry elements is adjusted for power control purposes. Power control may be open loop power control, closed loop power control, or a combination of open loop and closed loop power control. Power control may be performed according to one or more standardized operations such as cellular telephony standardized operations, WLAN operations, or another type of wireless interface operation standard that includes transmit power management. Thus, Step 614 of FIG. 6 includes adjusting the gain of one or more transmitter section components of the RF circuitry. As was most recently described with reference to FIG. 4, most typically in transmit power control operations, the gain of a PA or PA driver is adjusted. In normal operations, the gain of PA, PA driver, or other transmit path components is controlled by baseband processing circuitry. The determination of gain applied to these components may be based upon information received from a wirelessly coupled remote device. For example, when the wireless device is a cellular handset, a base station to which the wireless handset wirelessly couples will receive power control directives. Typically, these power control directives direct the wireless device to either increase or decrease its transmit power. When an increase gain direction is received from the base station, the wireless device handset will increase its transmit gain accordingly. Likewise, when a power decrease command is received from the base station, the wireless device handset will decrease the gain of its transmit path to resultantly decrease transmit power strength. As will be described further with reference to FIG. 11, calibration operations of Step 604 may be initiated based upon gain input average, gain input range, or other gain input value(s). The gain input to one, more than one, or all of the RF transmitter section components that have gain inputs will be considered.

Figure 7:
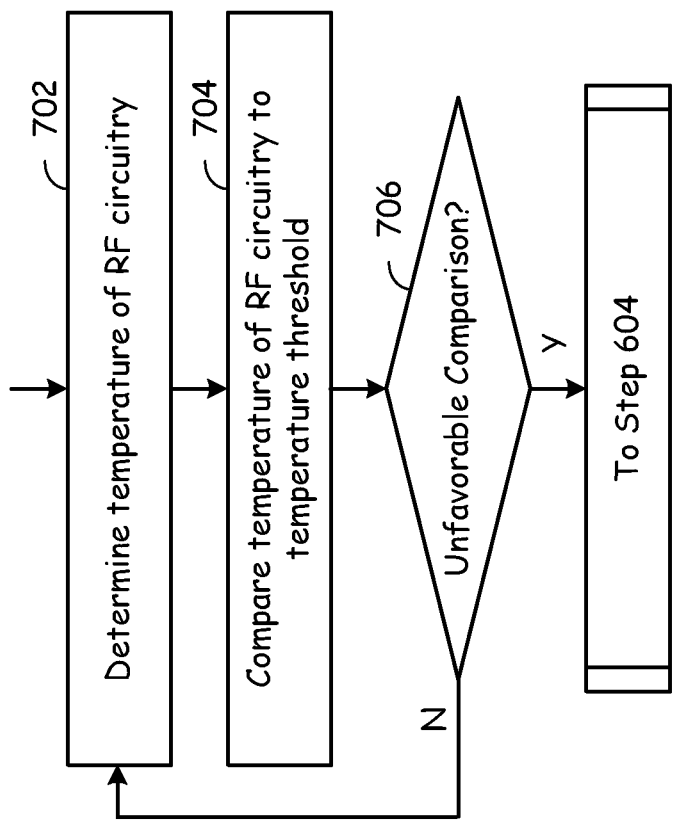
FIG. 7 is a flow chart illustrating operation according to an embodiment of the present invention for monitoring operational temperature of RF circuitry.

FIG. 7 is a flow chart illustrating operation according to a first embodiment of the present invention for monitoring operational temperature of RF circuitry. The operations 608/610 of FIG. 7 may correspond to the operations 608/610 of FIG. 6. The operations of FIG. 7 include the baseband processing circuitry or monitoring circuitry determining a temperature of the RF circuitry being monitored (Step 702). The baseband processing circuitry or monitoring circuitry then compares the temperature of the RF circuitry to one or more temperature thresholds (Step 704). The baseband processing circuitry/monitoring circuitry then determines whether the comparison is unfavorable (Step 706). When the comparison is not unfavorable, operation returns to Step 702 wherein the temperature of the RF circuitry continues to be monitored. However, upon unfavorable comparison of Step 706, operation proceeds to Step 604 wherein calibration operations are re-performed.

Figure 8:
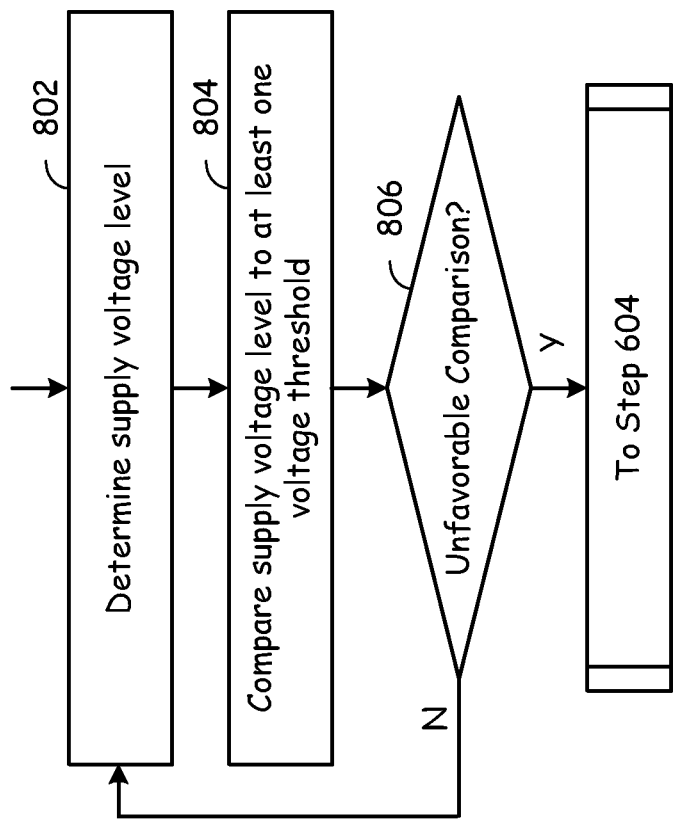
FIG. 8 is a flow chart illustrating operation according to the present invention in monitoring operational characteristics of the RF circuitry.

FIG. 8 is a flow chart illustrating operation according to the present invention in monitoring operational characteristics of the RF circuitry. The operations of FIG. 8 may correspond to Steps 608/610 of FIG. 6. Further, the operations of FIG. 8 may correspond to the structure of FIG. 5A or 5B. With the operations of FIG. 8, the monitoring circuitry or baseband processing circuitry determines a supply voltage level (Step 802). The measurement of the supply voltage level may be accomplished with to structures of FIG. 5A or 5B, for example. Then, the baseband processing circuitry or monitoring circuitry compares the supply voltage level to at least one voltage threshold (Step 804). Upon a favorable comparison of Step 804, operation returns to Step 802 wherein the supply voltage level continues to be monitored. However, upon another favorable comparison of Step 806, operation proceeds to Step 604 wherein calibration operations are re-initiated.

Figure 9:
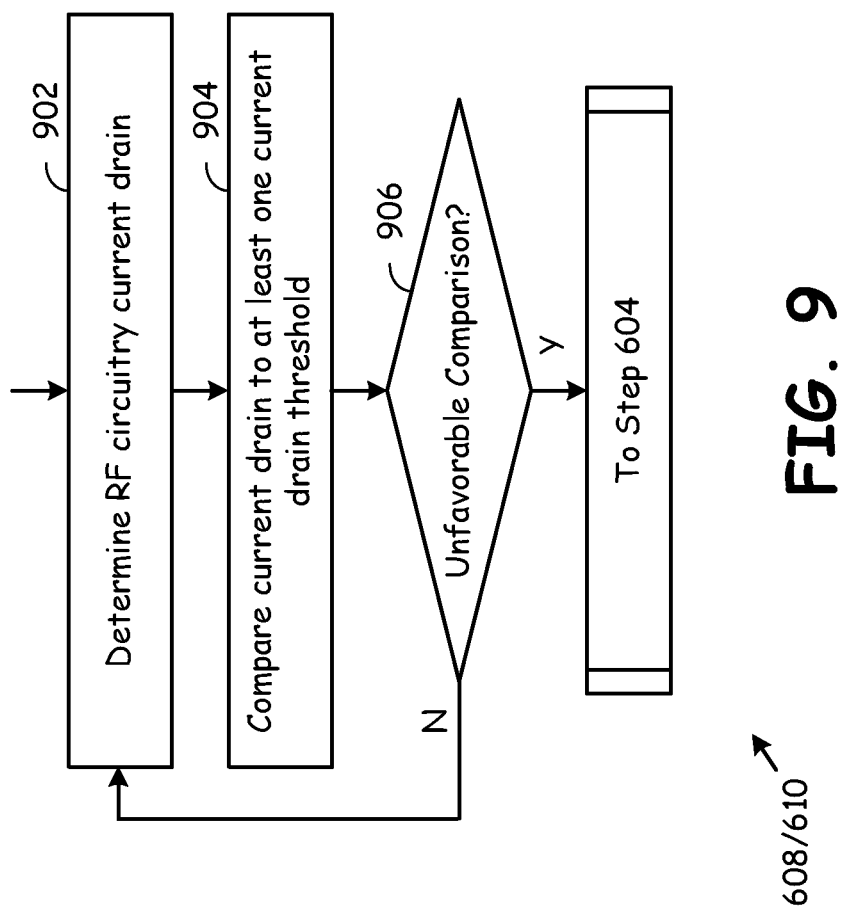
FIG. 9 is a flow chart illustrating operation according to the present invention for alternative RF circuitry characteristic monitoring.

FIG. 9 is a flow chart illustrating operation according to the present invention for alternative RF circuitry characteristic monitoring. The operations of FIG. 9 may correspond to Steps 608/610 of FIG. 6. Operation commences with the baseband processing circuitry or RF monitoring circuitry determining RF circuitry current drain (Step 1002). The operation of Step 902 may correspond to the structure of FIG. 5A where current sensor 506 measures the current drain through power amp 406. Next, the baseband processing circuitry or monitoring circuitry compares the current drain determined at Step 902 to at least one current drain threshold (Step 904). Upon a favorable comparison of the current drain to at least one current drain threshold as determined at Step 906, operation returns to Step 902 when the current drain continues to be monitored. However, upon an unfavorable comparison at Step 906, operation returns to Step 604 of FIG. 6 for re-initiation of the calibration operations.

Figure 10:
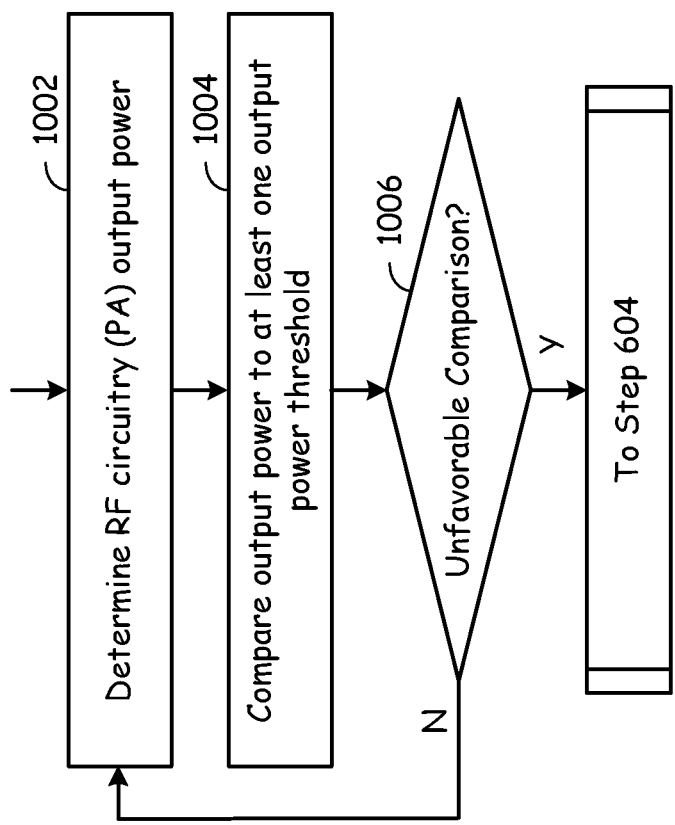
FIG. 10 is a flow chart illustrating yet another embodiment of monitoring operations according to one or embodiments of the present invention.

FIG. 10 is a flow chart illustrating yet another embodiment of monitoring operations according to one or more embodiments of the present invention. The operations of FIG. 10 may correspond to Steps 608/610 of FIG. 6. Further, the operations of FIG. 10 may correspond to the structure of FIG. 4 wherein the output of PA 406 is monitored. The monitoring circuitry 410 of baseband processing circuitry 402 monitors the gain input provided to PA 406. Further, the baseband processing circuitry/monitory circuitry determines an RF circuitry output power (Step 1002). The output power of the RF circuitry may be the output power of PA 406 as is indicated in FIG. 4 as monitored via coupling circuitry 412. The output power may be averaged over time or may be instantaneous as monitored. Then the baseband processing circuitry/monitoring circuitry compares the measured output power level to at least one output power threshold (Step 1004). Upon a favorable comparison as determined at Step 1006, operation returns to Step 1002. However, upon an unfavorable comparison at Step 1006, operation proceeds to Step 604 of FIG. 6 wherein calibration operations are re-initiated.

Figure 11:
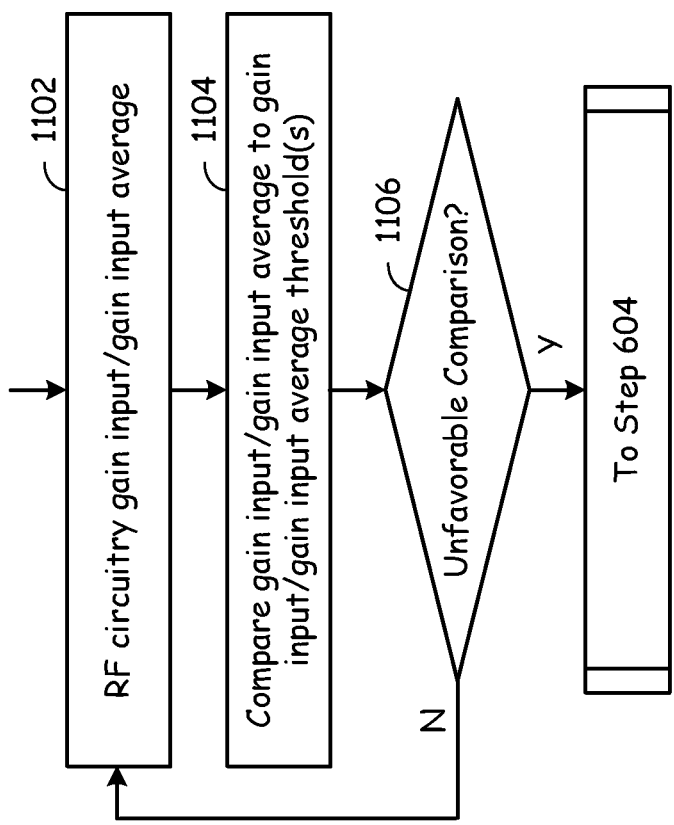
FIG. 11 is a flow chart illustrating operation according to an embodiment of the present invention for initiating calibration operations.

FIG. 11 is a flow chart illustrating operation according to an embodiment of the present invention for initiating calibration operations. The operations of FIG. 11 correspond to the structure of FIG. 4, and in particular that monitoring circuitry 410 of FIG. 4 monitors the gain input or gain inputs provided to the PA 406 and/or other transmit path gain adjustable components instantaneously or over a period of time. When the baseband processor and transmit path components are/is properly calibrated, the gain input(s) in some cases be substantially at a midpoint of the available gain settings. However, when a mismatch occurs via either a change in the input impedance of antenna or the distortion characteristics of the RF circuitry, the gain input(s) may average a much higher or lower level than the midpoint gain setting. Thus, the full gain range may no longer be available for power control operations.

Thus, according to the embodiment of FIG. 11, the monitoring circuitry 410 determines one or both of instantaneous gain inputs to the PA 406 or gain input average to the variable gain devices over time (Step 1102). The baseband processing circuitry or monitoring circuitry 410 contained therein compares the gain input or gain input average to a gain input or a gain input average threshold respectively (Step 1104). In some operations, the baseband processing circuitry 402 or monitoring circuitry 410 contained therein may compare only the instantaneous PA gain to the gain input threshold at Step 1104. In another embodiment, the baseband processing circuitry 402 or monitoring circuitry 410 contained therein may compare only the gain input average to a gain input average threshold at Step 1104. Further, in still another embodiment, comparisons to both the instantaneous gain applied and the average gain(s) that has/have been applied over time. In any of these cases, the comparison of Step 1104 may determine a drift in operational characteristics of the RF circuitry or antenna over time or alternatively may detect a relatively shorter term alteration in the operation of the RF circuitry or the antenna.

In one particular example, a user of the wireless device may set the wireless device onto a table top. When the user of the wireless device sets the wireless device upon a table top, the antenna gain pattern will change immediately. In such case, the change in the antenna gain pattern may also result in a change in the input impedance of the antenna, resulting in an immediate change in gain setting range. In such case, immediate re-calibration of the RF circuitry/baseband processing circuitry may be immediately required. So, an unfavorable comparison as determined at Step 1106, operation proceeds to Step 604 wherein calibration operations are initiated/re-initiated. Upon a favorable comparison at Step 1106, operation proceeds again to Step 1102 wherein the gain input/gain input average are continued to be monitored.

Each of the embodiments of FIGS. 7-11 may be individually applied to a wireless device according to the present invention. However, in other embodiments, multiple or all of the techniques illustrated in FIGS. 7-11 may be applied by a wireless device in determining when appropriate to re-perform calibration operations. Thus, none of the particular embodiments of the operations of Step 6 as described with reference to FIGS. 7-11 is required or may be excluded according to the present invention.

Figure 12:
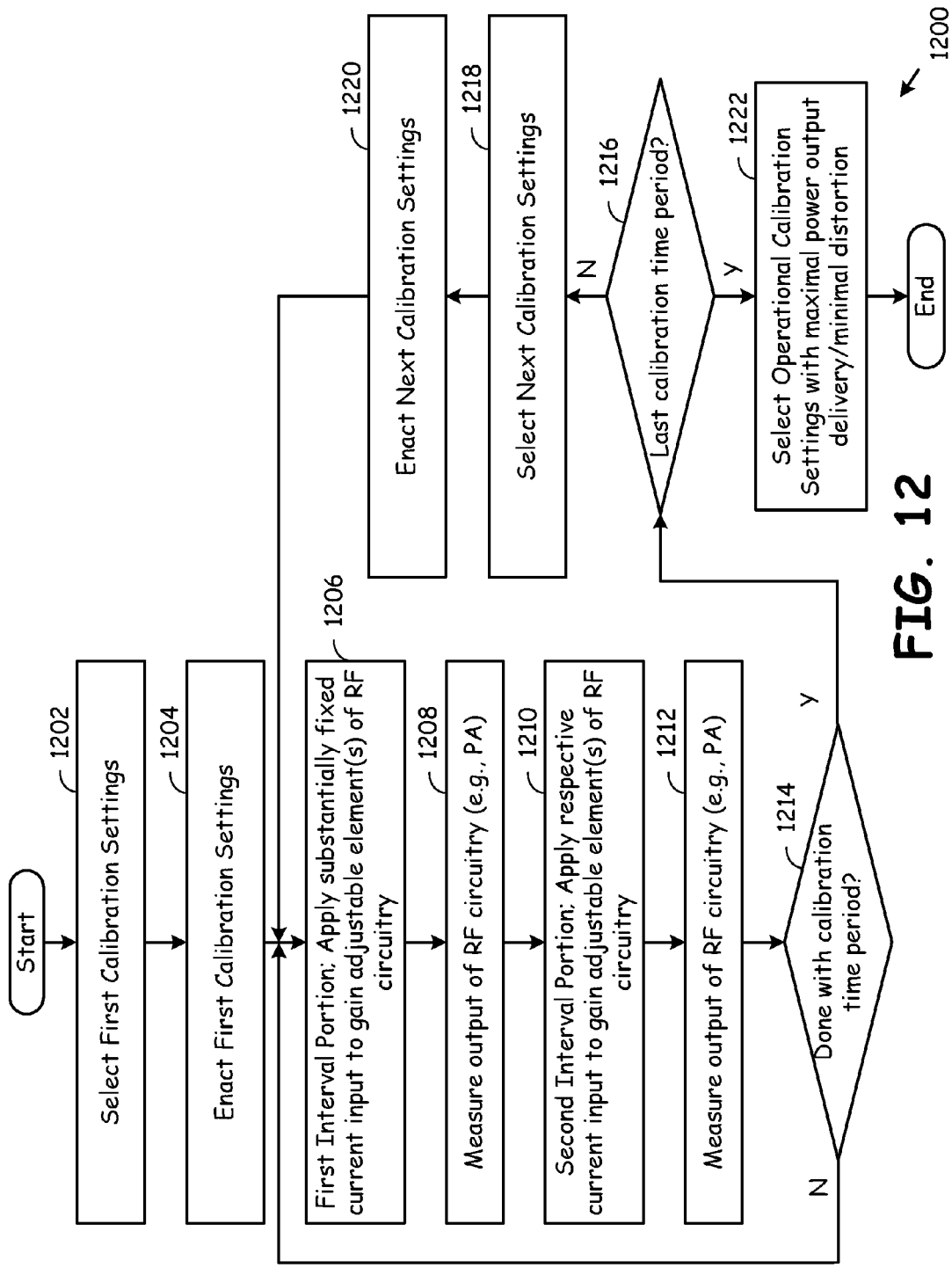
FIG. 12 is a flow chart illustrating operation for calibrating a transmitter of a wireless device according to one or more embodiments of the present invention.
Figure 13:
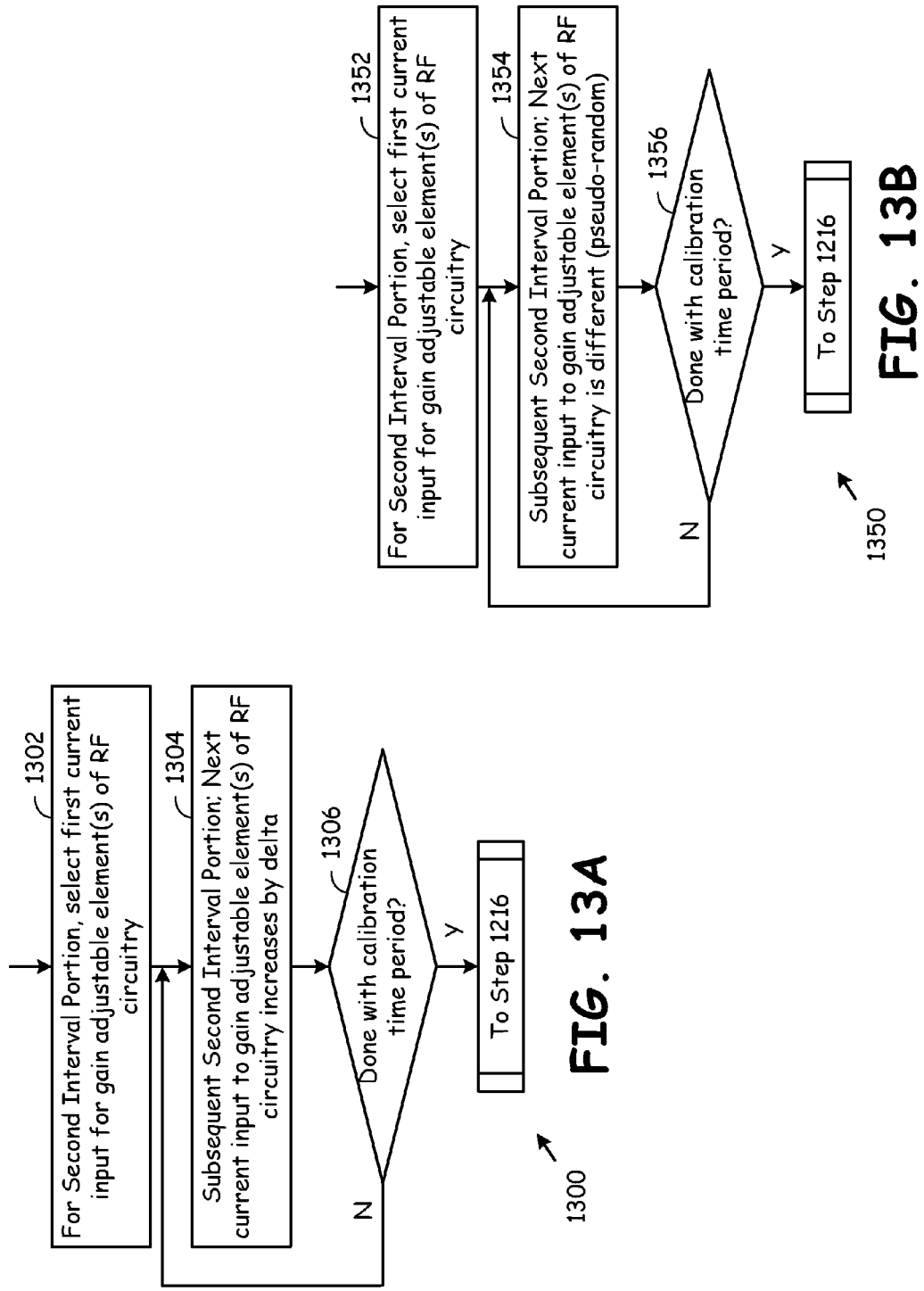
FIG. 13A is a flow chart illustrating an embodiment for applying current inputs to gain adjustable embodiments of the RF circuitry according to one or more embodiments to the present invention.
FIG. 13B is a flow chart illustrating another embodiment for applying current inputs to gain adjustable embodiments of the RF circuitry according to one or more embodiments to the present invention.

FIG. 12 is a flow chart illustrating operation for calibrating a transmitter of a wireless device according to one or more embodiments of the present invention. The operations 1200 of FIG. 12 will be further described with reference to particular embodiments illustrated in FIGS. 13-17. The operations 1200 of FIG. 12 commence with the baseband processing circuitry selecting first calibration settings which include baseband processing circuitry pre-distortion settings and/or transmitter section calibration settings, e.g., DAC settings, mixer settings, PA settings, filter settings, etc. (Step 1202). The operations 1200 of FIG. 12 are performed at Step 604 of FIG. 6 and may be based upon various determinations made by monitoring aspects of the transmitter of the wireless device as was described with reference to FIGS. 1-11. The calibration settings selected at Step 1202 may include particular pre-distortion of a baseband signal produced by baseband processing circuitry to the RF circuitry of the wireless device. Such particular pre-distortion may alter the frequency and/or phase of a signal produced. For example, some pre-distortion settings may alter the magnitude of some frequency components of the baseband signal but not others. Further, some pre-distortion settings may alter the phase of some frequency components of the baseband signal but not others. The baseband processing circuitry has a number of differing pre-distortion settings from which to select.

After selection of the first calibration settings the baseband processing circuitry enacts the first calibration settings (Step 1204). The baseband processing circuitry may select the calibration settings from a set of calibration settings with the calibration operations 1200 of FIG. 12 stepping through the various calibration settings. However, in other embodiments, the calibration settings may be based upon a mathematical algorithm that attempts to determine an optimal set of calibration. Details of methodologies for selecting calibration settings are not described further herein except as how they apply to the teachings of the present invention.

Figure 14:
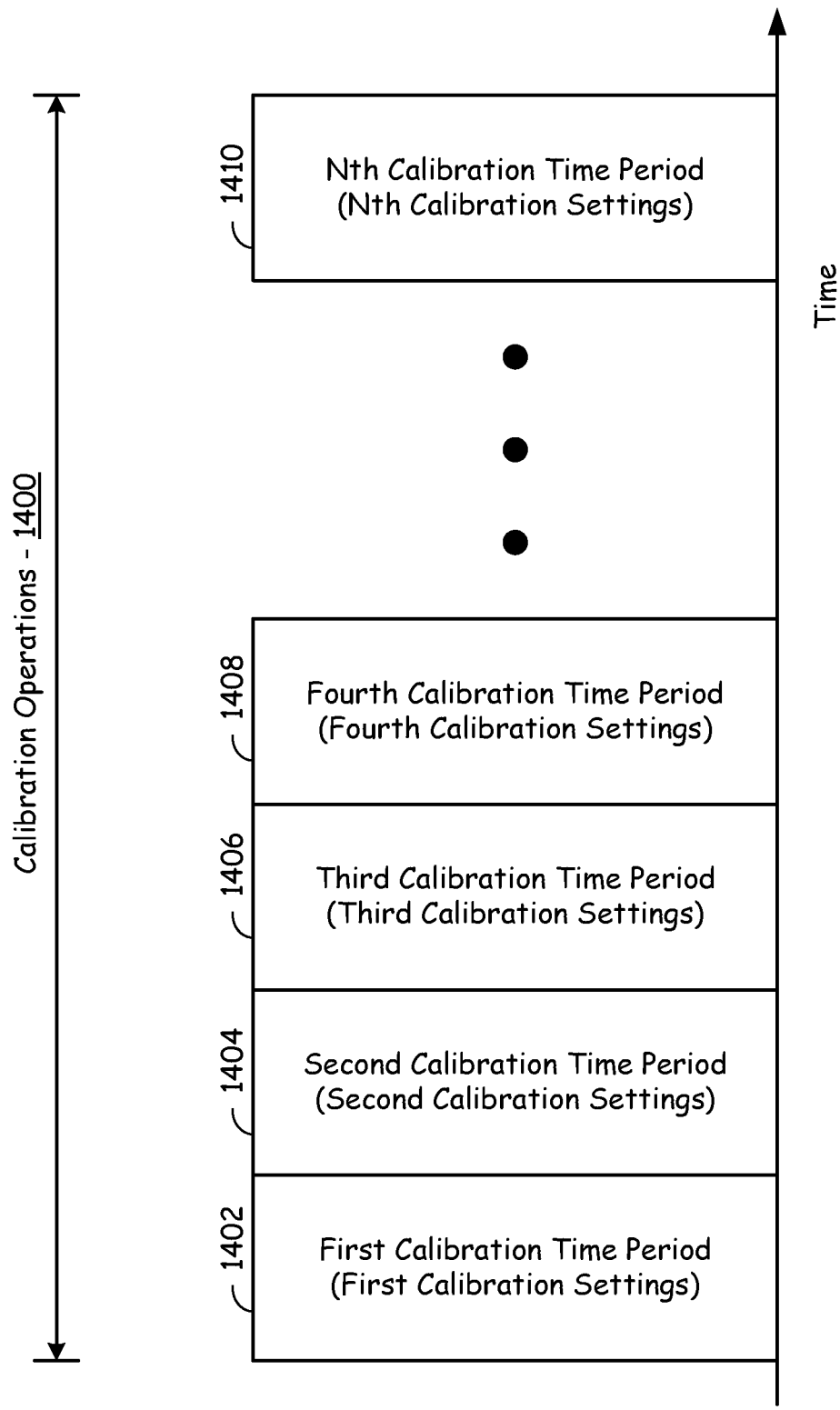
FIG. 14 is a block diagram illustrating the time division nature of calibration operations according to one or more embodiments of the present invention.

With the first calibration settings enacted, the baseband processing circuitry enters a first calibration time period of a plurality of calibration time periods. Referring briefly to FIG. 14, calibration operations 1400 of the RF section of the transmitter of the wireless device are broken into a plurality of calibration time periods 1402, 1404, 1406, 1408, and 1410. Each of these calibration time periods is divided into a plurality of first interval portions that are interspersed with a plurality of second interval portions. Each calibration time period of the plurality of calibration time periods 1402, 1404, 1406, 1408, and 1410 includes the plurality of first interval portions and the plurality of second interval portions, with the plurality of first interval portions interspersed with the plurality of second interval portions. The various embodiments of interval portions will be further described herein with reference to FIGS. 15-17.

Referring again to FIG. 12, during the first interval portion of the calibration time period enacted the baseband processing circuitry applies a substantially fixed current input to one or more gain adjustable elements of the RF circuitry of the transmitter of the wireless device (Step 1206). As was described previously herein with reference to FIG. 4, the baseband processing circuitry 402 applies one or more gain settings to the analog transmit path components. Thus, in Step 1206, the baseband processing circuitry 402 applies a substantially fixed current input/gain setting to the transmit path components of the RF circuitry. Then, monitoring circuitry, (e.g., monitoring circuitry 408 or 410 of FIG. 4) measures the output of the RF circuitry with the gain setting applied at Step 1206 (Step 1208). In one particular embodiment, the output of the PA 406 of FIG. 4 is monitored via coupling circuitry 412. The output may be monitored via current, voltage, or current and voltage to determine a power output of the PA 406 that would be pushed into antenna 414. However, in some embodiments, the measuring at step 1208 is neglected because it is during the first interval portions.

The operations 1200 of FIG. 12 continue with the baseband processing circuitry, via a particular second interval portion of the plurality of second interval portions applying a respective current input/gain to the gain adjustable element or elements of RF circuitry (Step 1210). Then, the baseband processing circuitry via monitoring circuitry measures the output of the RF circuitry, for example at the output of the PA (Step 1212). Operation 1200 then proceeds to Step 1214 where the baseband processing circuitry determines whether the first interval portions and second interval portions of the current calibration time period are completed, i.e., has particular calibration time period finished. When the current calibration time period is not completed, operation turns to Step 1206 wherein first interval portion and second interval portion measurements are again performed. However, when the calibration time period is completed, operation proceeds to Step 1216 wherein the baseband processing circuitry determines whether or not the last calibration time period has been completed.

If the last calibration time period has not been completed at Step 1216 operation proceeds to Step 1218 wherein a next set of calibration settings are selected. These next set of calibration settings are then enacted (Step 1220) and operation proceeds again to Step 1206. However, after the plurality of calibration time periods have been completed, as determined at Step 1216, the baseband processing circuitry selects operational calibration settings that have resulted in maximal power output delivery and/or minimal distortion of the RF signal produced by the PA (Step 1222). Of course, the maximal power output delivery would be measured across the plurality of gains applied to the RF circuitry via the calibration time periods. Thus, the calibration settings selected for the baseband processing circuitry would typically include a best set of operations across the various first interval portions and second interval portions.

According to various aspects of the present invention, each of the plurality of first interval portions may have substantially equal duration. Further, each of the plurality of second interval portions may have substantial equal duration. Moreover, each of the plurality of second interval portions may have substantial equal durations to each of the first interval portions. Details of various embodiments of the interval portions will be described further herein with reference to FIGS. 15-17.

FIG. 13A is a flow chart illustrating an embodiment for applying current inputs to gain adjustable embodiments of the RF circuitry according to one or more embodiments to the present invention. Operation 1300 of FIG. 13A commences with, for a second interval portion, selecting a first current input for gain adjustable elements of the RF circuitry (Step 1302). Then, during subsequent second interval portions, differing current inputs are selected for application to the gain adjustable elements of the RF circuitry when the current input gain is increased by a delta from a previous current input (Step 1304). For example, the embodiment of FIG. 13A will be described further herein with reference to FIGS. 15 and 16. Operation proceeds from Step 1304 to Step 1306 where it is determined whether or not calibration time period is completed. If not, operation returns to Step 1304 for the next second interval portion. If so, then operation proceeds to Step 1216 of FIG. 12.

FIG. 13B is a flow chart illustrating another embodiment for applying current inputs to gain adjustable embodiments of the RF circuitry according to one or more embodiments to the present invention. Operation 1350 of FIG. 13B commences with the selection of a first input for the gain adjustable element of the RF circuitry (Step 1352). This current input would be applied during a second interval portion of the plurality of interval portions of a particular calibration time period. Operation 1350 of FIG. 13B continues with, for a subsequent second interval portion, selecting a next current input for application to the gain adjustable(s) of the RF circuitry. However, as contrasted to the operation of Step 1304, operation of Step 1354 includes selecting a pseudo-random differing current input. This pseudo-random sequence of inputs during the second interval portions may be pre-selected or it may be pseudo-randomly generated for the various calibration time periods in second interval portions thereof. A particular embodiment of Step 1354 will be described hereinafter with reference to FIG. 17. Operation proceeds from Step 1354 to Step 1356 where it is determined whether or not the calibration time period has been completed. If not, operation returns to Step 1354 for selection of a subsequent second interval portion current input. When the determination of Step 1356 is that calibration time period and has been completed operation proceeds to Step 1216 of FIG. 12.

FIG. 14 is a block diagram illustrating the time division nature of calibration operations according to one or more embodiments of the present invention. As was previously discussed with reference to FIG. 12, the calibration operations 1400 include the plurality of calibration time periods 1402-1410. Each of these calibration time periods includes the plurality of first interval portions that are interspersed with the plurality of second interval portions.

Figure 15:
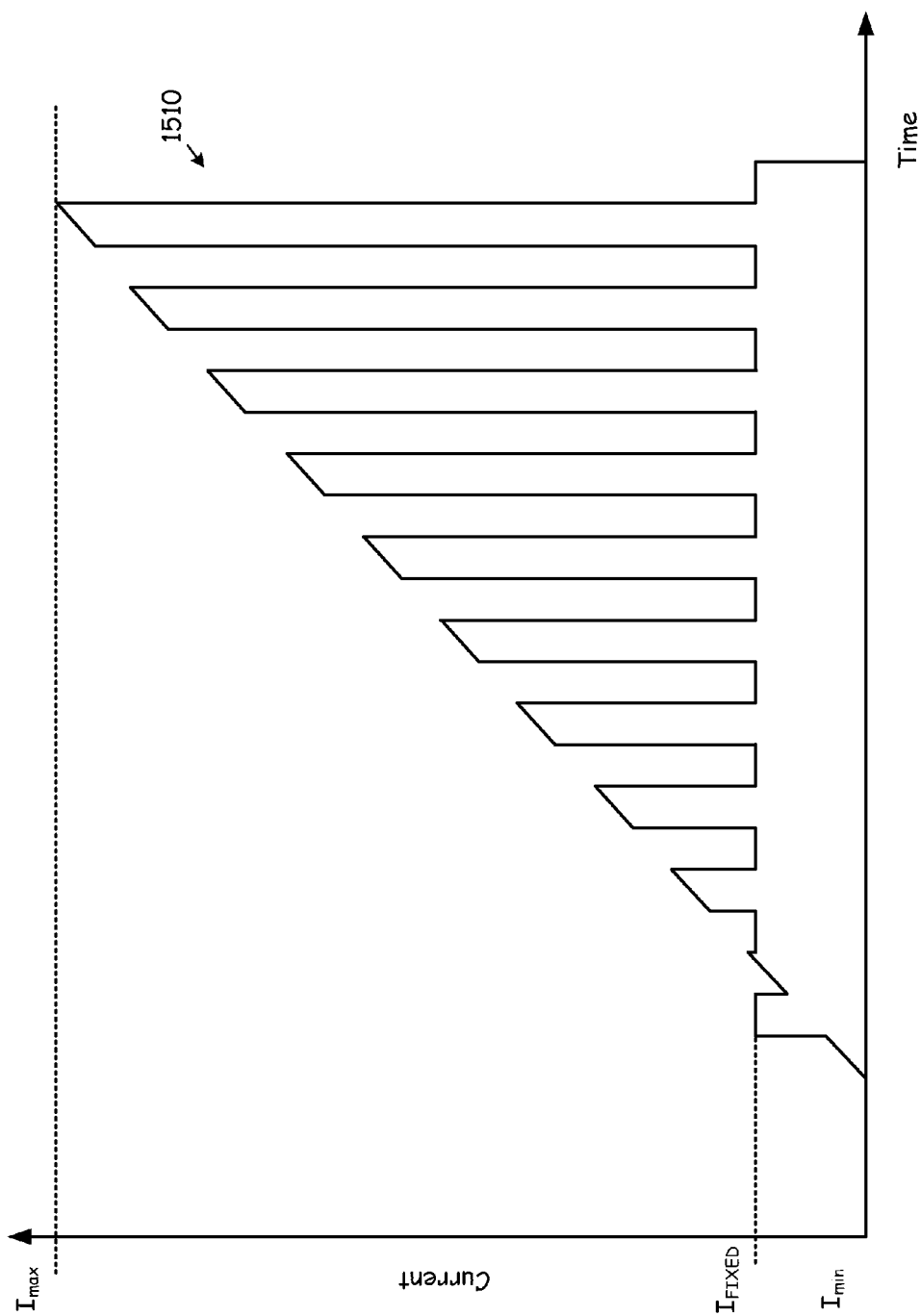
FIG. 15 is a graph illustrating gain/current inputs during a particular calibration time period according to one or more embodiments to the present invention.

FIG. 15 is a graph illustrating current/current inputs during a particular calibration time period according to one or more embodiments to the present invention. As illustrated in FIG. 15, a current input 1510 as is applied to one or more gain adjustable elements of the RF circuitry is shown. The current input is substantially ramped for successive second interval portions. The second interval portion current inputs go from $I_{min}$ to $I_{max}$ ramping from low to high. Further, the fixed first current input corresponding to the first interval portions is substantially at $I_{FIXED}$. Thus, during a particular calibration time period, or during the plurality of calibration time periods, the current input provided to the at least one gain adjustable element of the RF circuitry ramps from $I_{min}$ to $I_{max}$ while being interspersed from the ramp input current to the substantially fixed first current input.

By having the ramping, relatively higher current inputs to the at least one adjustable gain element of the RF circuitry are interspersed with the fixed first current input, the overall current drain on the battery of the wireless device or the power supply of the wireless device is reduced. Such is the case because capacitors of a power supply of the wireless device are better able to provide the peak current requirements of the calibration operations during the second interval portions. Without such interspersing of the relatively higher and fixed current loads on the battery, the battery would discharge more quickly.

Figure 16:
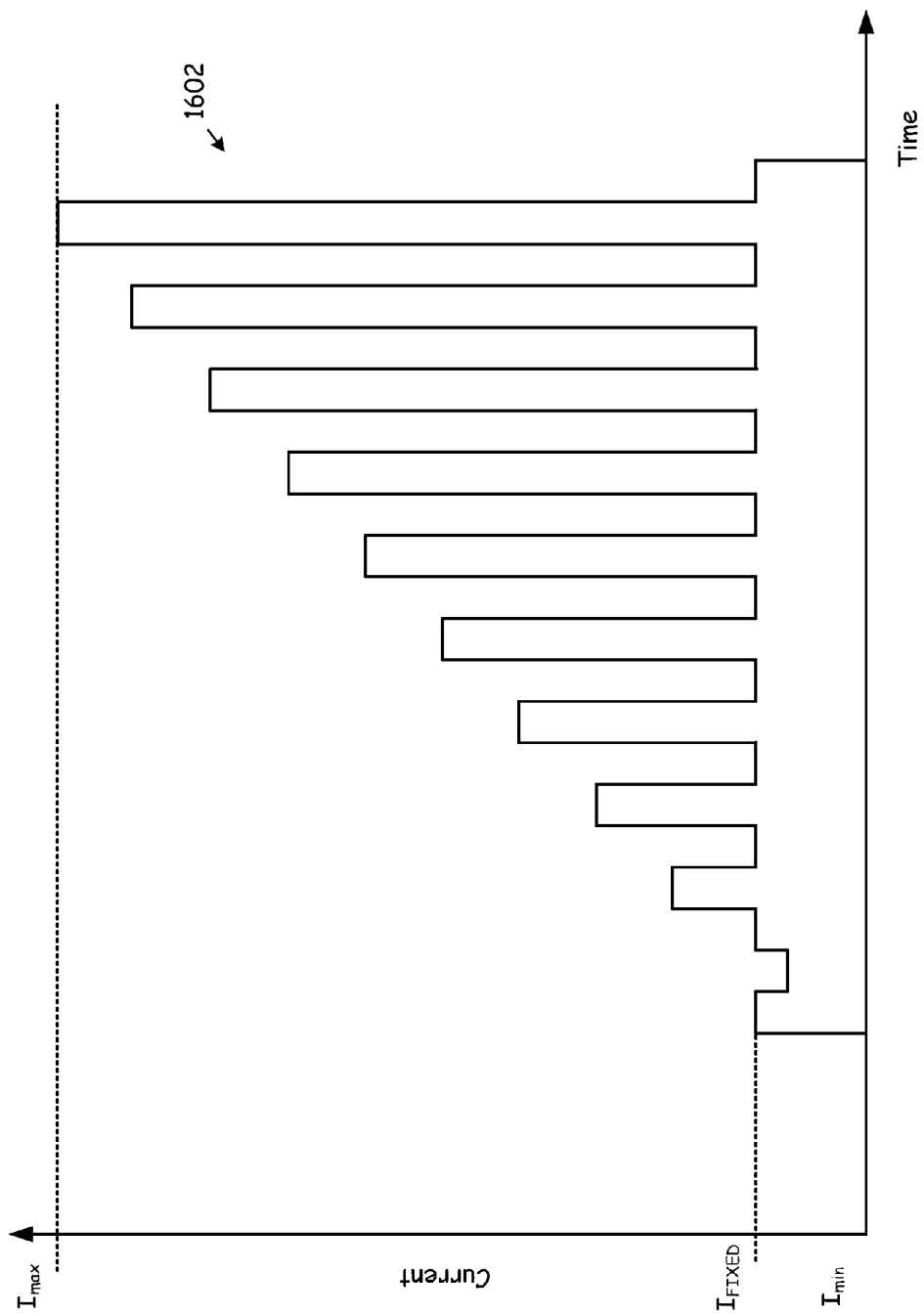
FIG. 16 is a graph illustrating another embodiment of gain/current inputs to the at least one gain adjustable element according to the present invention.

FIG. 16 is a graph illustrating another embodiment of gain/current inputs to the at least one gain adjustable element according to the present invention. As contrasted to the current input pattern of 1510 of FIG. 15, the current input pattern 1602 of FIG. 16 has stair-stepped current inputs that ramp from $I_{min}$ to $I_{max}$. Interspersed with the ramped current inputs from $I_{min}$ to $I_{max}$ are substantially fixed first current inputs that corresponds to the first interval portions. The stair-stepped current input corresponds to the second interval portions. However, as contrasted to the embodiment of FIG. 15, the current input is fixed at each stair-step.

Figure 17:
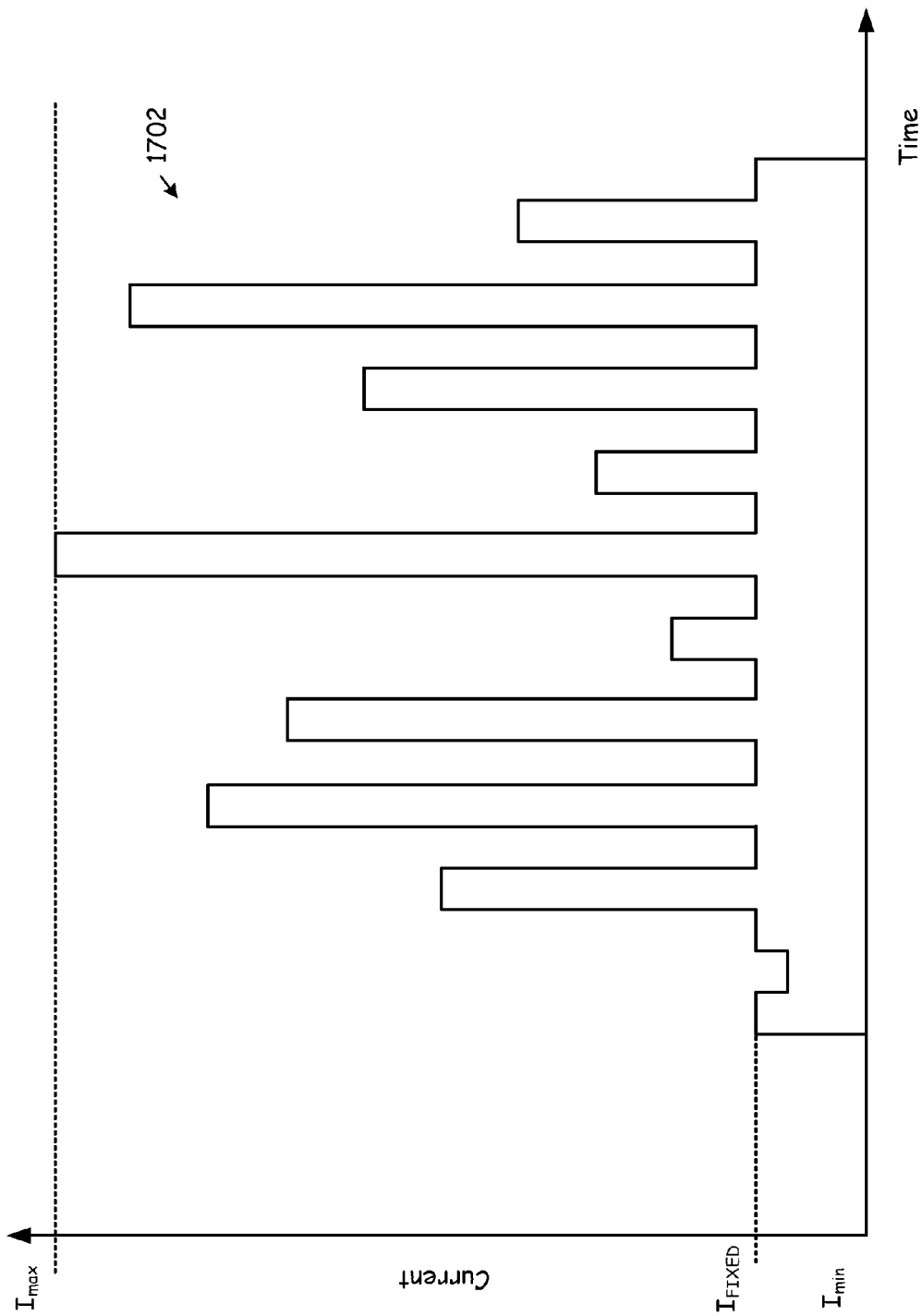
FIG. 17 is a graph illustrating gain/current input provided to at least one gain adjustable element of the RF circuitry of a wireless device according to another embodiment of the present invention during calibration operations.

FIG. 17 is a graph illustrating yet another embodiment of gain/current inputs to the at least one gain adjustable element according to the present invention. The current input profile 1702 of FIG. 17 shows how the input current to the at least one gain adjustable element varies over time. The current applied to at least one gain adjustable element during the first interval portions is substantially fixed. However, the current applied to the at least one adjustable gain element of the RF circuitry during the second interval portions varies from $I_{min}$ to $I_{max}$. The current input profile 1702 of FIG. 17 varies from that of FIGS. 15 and 16 in that the gain input is not ramped from $I_{min}$ to $I_{max}$ over time but instead has a differing non-ramped pattern. The current profile 1702 may be pseudo-randomly generated or pre-programmed into the baseband processing circuitry of the wireless device for application during the calibration operations.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

We claim:

1. A wireless device comprising:
 a Radio Frequency (RF) circuitry coupled to receive a baseband signal, to convert the baseband signal to an RF signal, and to transmit the RF signal;
 a baseband processing circuitry coupled to the RF circuitry, wherein the baseband processing circuitry is operable to produce the baseband signal, such that it is pre-distorted to compensate for antenna matching impedance and signal distortion characteristics of the RF circuitry, and wherein the baseband signal that is pre-distorted is based upon calibration operations that is to be initiated when an operational characteristic of the wireless device compares unfavorably to an operational threshold, in which the calibration operations include application of a fixed current to at least one gain adjustable element of the RF circuitry and application of different current values than the fixed current at respective plurality of intervals; and
 a monitoring circuitry coupled to the RF circuitry and to the baseband processing circuitry to monitor the operational characteristic of the wireless device.

2. The wireless device of claim 1, wherein the monitoring circuitry to monitor temperature of the RF circuitry as the operational characteristic.

3. The wireless device of claim 1, wherein the monitoring circuitry to monitor conductivity of a semiconductor material of the RF circuitry as the operational characteristic.

4. The wireless device of claim 1, wherein the monitoring circuitry to monitor resistivity of a semiconductor material of the RF circuitry as the operational characteristic.

5. The wireless device of claim 1, wherein the monitoring circuitry to monitor supply voltage to a component of the RF circuitry as the operational characteristic.

6. The wireless device of claim 1, wherein the monitoring circuitry to monitor current to a component of the RF circuitry as the operational characteristic.

7. The wireless device of claim 1, wherein the monitoring circuitry to monitor current drain of a power amplifier of the RF circuitry as the operational characteristic.

8. The wireless device of claim 1, wherein the monitoring circuitry to monitor instantaneous current drain of a power amplifier of the RF circuitry as the operational characteristic.

9. The wireless device of claim 1, wherein the monitoring circuitry to monitor average current drain of a power amplifier of the RF circuitry as the operational characteristic.

10. The wireless device of claim 1, wherein the monitoring circuitry to monitor gain input to a gain adjustable component of the RF circuitry as the operational characteristic.

11. The wireless device of claim 1, wherein the monitoring circuitry to monitor instantaneous gain input to a gain adjustable component of the RF circuitry as the operational characteristic.

12. The wireless device of claim 1, wherein the monitoring circuitry to monitor average gain input to a gain adjustable component of the RF circuitry as the operational characteristic.

13. A wireless device comprising:
a Radio Frequency (RF) circuitry coupled to receive a baseband signal, to convert the baseband signal to an RF signal, and to transmit the RF signal;
a baseband processing circuitry coupled to the RF circuitry, wherein the baseband processing circuitry is operable to produce the baseband signal, such that it is pre-distorted to compensate for antenna matching impedance and signal distortion characteristics of the RF circuitry, and wherein the baseband signal that is pre-distorted is based upon calibration operations that is to be initiated when an operational characteristic of the wireless device compares unfavorably to an operational threshold, in which the calibration operations include application of a fixed current to at least one gain adjustable element of the RF circuitry and application of different current values than the fixed current at respective plurality of intervals wherein the different current values have discrete values; and
a monitoring circuitry coupled to the RF circuitry and to the baseband processing circuitry to monitor the operational characteristic of the wireless device.

14. The wireless device of claim 13, wherein the different current values at respective plurality of intervals have discrete values that follow a ramped pattern.

15. The wireless device of claim 13, wherein the different current values at respective plurality of intervals have discrete values that follow a stair-stepped pattern.

16. The wireless device of claim 13, wherein the different current values at respective plurality of intervals have discrete values that follow a pseudo-random generated pattern.

17. A method for operating a wireless device comprising:
producing a baseband signal in a baseband processing circuitry coupled to a RF circuitry for transmission of a RF signal from the RF circuitry, wherein the baseband processing circuitry is operable to produce the baseband signal, such that it is pre-distorted to compensate for antenna matching impedance and signal distortion characteristics of the RF circuitry, and wherein the baseband signal that is pre-distorted is based upon calibration operations that is to be initiated when an operational characteristic of the wireless device compares unfavorably to an operational threshold;
monitoring the operational characteristic in a monitoring circuitry coupled to the RF circuitry and to the baseband processing circuitry;
initiating the calibration operation when the operational characteristic of the wireless device compares unfavorably to an operational threshold by applying a fixed current to at least one gain adjustable element of the RF circuitry and application of different current values than the fixed current at respective plurality of intervals wherein the different current values have discrete values; and
transmitting the RF signal from the RF circuitry.

18. The method of claim 17, wherein the different current values at respective plurality of intervals have discrete values that follow a ramped pattern.

19. The method of claim 17, wherein the different current values at respective plurality of intervals have discrete values that follow a stair-stepped pattern.

20. The method of claim 17, wherein the different current values at respective plurality of intervals have discrete values that follow a pseudo-random generated pattern.

* * * * *